United States Patent
Hughes et al.

(10) Patent No.: US 7,266,787 B2
(45) Date of Patent: Sep. 4, 2007

(54) METHOD FOR OPTIMISING TRANSISTOR PERFORMANCE IN INTEGRATED CIRCUITS

(75) Inventors: Peter William Hughes, Henleaze (GB); Shannon Vance Morton, Redland (GB); Trevor Kenneth Monk, Tutshill (GB)

(73) Assignee: Icera, Inc., Bristol (GB)

( * ) Notice: Subject to any disclaimer, the term of this patent is extended or adjusted under 35 U.S.C. 154(b) by 219 days.

(21) Appl. No.: 11/067,200

(22) Filed: Feb. 24, 2005

(65) Prior Publication Data

US 2006/0186478 A1   Aug. 24, 2006

(51) Int. Cl.
*G06F 17/50* (2006.01)

(52) U.S. Cl. .............................. 716/1; 2/9; 2/10; 2/11

(58) Field of Classification Search ............... 716/1–2, 716/7–12, 17; 257/202, 206–208, 368–369, 257/390; 438/238, 260, 264, 587; 365/149, 365/185, 185.1, 185.2
See application file for complete search history.

(56) References Cited

U.S. PATENT DOCUMENTS

| | | | |
|---|---|---|---|
| 4,700,316 A | 10/1987 | Nair | |
| 5,701,255 A | 12/1997 | Fukui | |
| 6,163,877 A | 12/2000 | Gupta | |
| 6,393,601 B1 | 5/2002 | Tanaka et al. | |
| 6,410,972 B1 | 6/2002 | Sei et al. | |
| 2002/0137307 A1* | 9/2002 | Kim et al. | 438/432 |
| 2003/0023935 A1* | 1/2003 | McManus et al. | 716/1 |
| 2003/0023937 A1 | 1/2003 | McManus et al. | |
| 2004/0031004 A1* | 2/2004 | Yoshioka | 716/7 |
| 2004/0060030 A1* | 3/2004 | Fujimoto | 716/12 |
| 2004/0095797 A1* | 5/2004 | Yuan et al. | 365/145 |
| 2004/0143797 A1* | 7/2004 | Nguyen et al. | 716/1 |
| 2004/0168141 A1* | 8/2004 | Wang et al. | 716/8 |
| 2006/0003522 A1* | 1/2006 | Lin et al. | 438/238 |

OTHER PUBLICATIONS

Krishna B., et al: "Diffusion Sharing Across Cell Boundaries In Cell Based Design," Circuits and Systems, 1996., IEEE 39th Midwest Symposium on Ames, IA, USA Aug. 18-21, 1996, New York, NY, USA, IEEE, US, vol. 1, Aug. 18, 1996, pp. 349-352.

Gupta A., et al: "Clip: An Optimizing Layout Generator for Two-Dimensional CMOS Cells," Proceedings of the Design Automation Conference. Anaheim, Jun. 9-13, 1997, New York, ACM, US, vol. CONF. 34, Jun. 9, 1997, pp. 452-455.

Gupta A., et al: "Near-Optimum Hierarchical Layout Synthesis of Two-Dimensional CMOS Cells," VLSI Design 1999. Proceedings. Twelfth International Conference on Goa, India Jan. 7-10, 1999, Los Alamitos, CA, USA, IEEE Comput. Soc, US, Jan. 7, 1999, pp. 453-459.

* cited by examiner

*Primary Examiner*—Paul Dinh
(74) *Attorney, Agent, or Firm*—McDermott Will & Emery LLP

(57) ABSTRACT

A method (300) for optimising transistor performance in semiconductor integrated circuits built from standard cells (12), or custom transistor level layout, is disclosed. An active area of NMOS diffusion is extended with a joining area (102) between two adjacent cells (112) having the same net on diffusion at the adjacent edges of each cell. The diffusion area is extended to limit the occurrence of active and nonactive interface to minimise lattice strain effects and improve transistor performance.

38 Claims, 5 Drawing Sheets

METHOD FOR OPTIMISING TRANSISTOR PERFORMANCE IN INTEGRATED CIRCUITS

FIELD OF THE INVENTION

This invention relates generally to integrated circuits, and more particularly to methods for optimising performance of logic cells within a standard cell library for large scale integration of semiconductor integrated circuits.

BACKGROUND

Conventional standard cell libraries in semiconductor integrated circuits (IC) primarily contain a logic cell layout based in a metal oxide semiconductor (MOS) environment, in particular a complimentary metal oxide semiconductor (CMOS) environment. A standard cell is a pre-designed layout of transistors or non-specific collection of logic gates that are typically designed with computer assisted design (CAD) applications. The cells are usually interconnected or wired together in a particular manner with means of a placement and routing tool to perform a specific type of logical operation in an application specific IC (ASIC). A conventional ASIC layout is typically defined by an array of logic cells arranged in adjacent rows. Such a row 10 is shown in FIG. 1. The row of cells is depicted for illustrative purposes as a layout representation of abutting logic cells 12,31,32,33,35 bound by power and ground rails 14,16. Each logic cell defines a specific logic circuit. The active areas or components of the logic cell include negative-channel diffusion 24, positive-channel diffusion 26, and gate 34 layers. The components of the logic cells are wired internally with vias 28 and metal layer 18,20,22 to form simple logic (NMOS and PMOS) gates to perform Boolean and logic functions, for example INVERTER (or NOT) 12,35, AND, OR, NAND 31, NOR 32, 33 XOR, XNOR, ADDERS, FLIP-FLOP, and the like. In the design of the interconnection layout, integrated circuit design rules must be observed, for example, minimum width of transistor width, minimum width of metal tracks, and the like.

Recent advances made in semiconductor technology have enabled cell library layout designers to work on the nanometer scale. However, as a result of this technology scaling, additional problems have surfaced concerning the physical properties of the ASIC. Such a problem includes stress occurring in materials near an interface of different materials with different crystallographic structures or thermal expansion coefficients. The stress creates strain in the active and shallow trench isolation (STI) regions 36 within the cell. The strain related with these physical interactions substantially effects the characteristics of the component transistors in the integrated circuit. For example, in the NMOS and PMOS devices, such as field effect transistors (FET), the impact of the stress may be severe and result in 10% or more variation of output performance. Noticeably, in the NMOS devices, lattice strain is responsible for a reduction in the current between source and drain ($I_D$). A similar variation is reflected in the PMOS device, however, the fluctuation is a positive increase which actually is a beneficial variation improving the PMOS device performance.

Thus, there is a need for a method to avoid the reduction in drain current which is effected adversely by lattice stresses between the active regions and STI regions of the transistor devices of semiconductor integrated circuits.

STATEMENT OF THE INVENTION

An aspect of the invention provides a method for optimising transistor performance in an integrated circuit, comprises providing an integrated circuit having at least two cells, each cell having a logic function defined by the interconnection between active regions, non-active regions and power rails, each cell having an edge defined by a non-active region each cell having a connection between an active diffusion region and a power rail; identifying at least two adjacent cells each having a corresponding connection between an active region to the same power rail; and joining the respective active regions associated with each corresponding connection of each cell with an additional diffusion area across the boundary between the cells forming the connected diffusion of the two adjacent cells.

An aspect of the invention provides a method for building an integrated circuit having a connected diffusion cell architecture, comprises: providing a logic cell library having at least one cell, each cell having a logic function defined by the interconnection between active regions, non-active regions and power rails, each cell having an edge defined by a non-active region, each cell having a connection between an active region and a power rail; placing cells from the logic cell library into the integrated circuit; identifying at least two adjacent cells in the integrated circuit each having a corresponding connection between an active region to the same power rail; and joining the respective active regions associated with each corresponding connection of each cell with an additional diffusion area across the boundary between the cells forming the connected diffusion of the two adjacent cells.

In an embodiment the active regions comprise a positive diffusion area, a negative diffusion area and a gate area. The connected diffusion may be the negative diffusion area or wherein each negative diffusion area of each adjacent cell are connected and each positive diffusion area of each adjacent cell are connected. The corresponding connection may be positioned along the edge of the cell forming a boundary between the two cells and the two corresponding connections. Additionally, an embodiment may further comprise reorientating a cell having a corresponding connection positioned along an edge, the cell being reoriented with the edge having the corresponding connection adjacent to and forming the boundary between the two cells for joining the diffusion areas.

An aspect of the invention provides an integrated circuit having a connected diffusion cell architecture, comprising: at least two adjacent cells, each cell having a logic function defined by the interconnection between active regions, non-active regions and power rails, each cell having an edge defined by a non-active region, each cell having a connection between an active region and a power rail; additional diffusion area across the boundary between the cells joining the respective active diffusion region associated with the corresponding connection of each cell forming the connected diffusion of the two adjacent cells.

BRIEF DESCRIPTION OF THE DRAWINGS

A method for incorporating the present invention will now be described, by way of example only, with reference to the accompanying drawings, in which.

DETAILED DESCRIPTION

Figure 1:
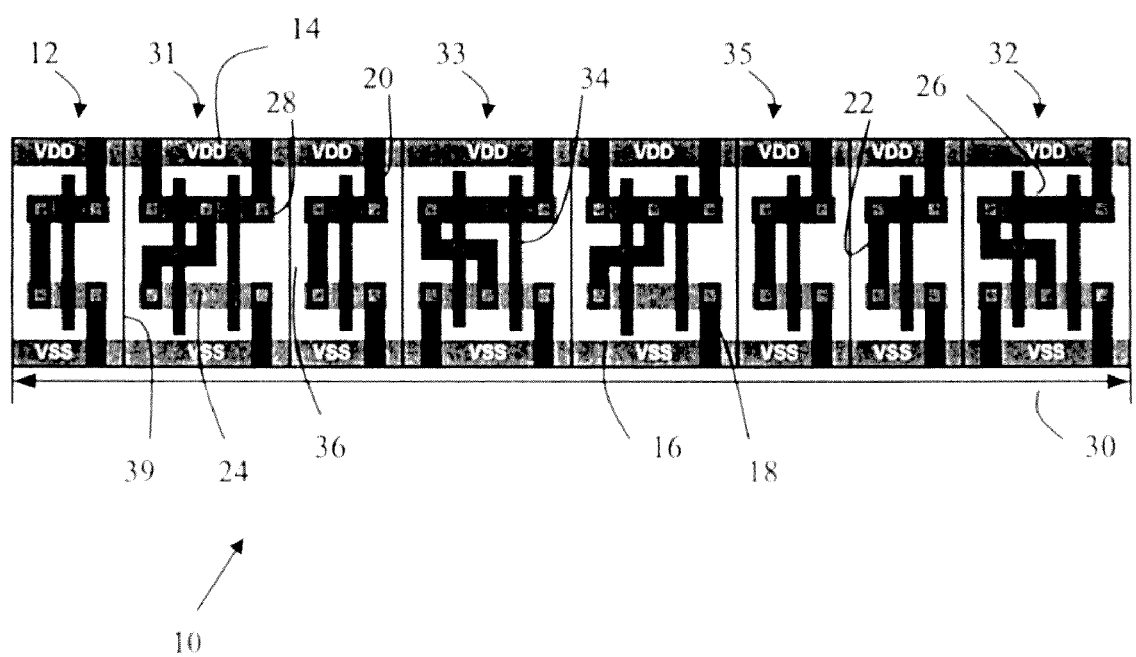
FIG. 1 shows a physical layout design of a row of cell structures within a CMOS environment.

With reference to FIG. 1, a physical layout of a row of logic cells is shown arranged in a conventional manner. A conventional cell includes non-active areas 36, for example STI regions, surrounding active areas or regions 24,26,34 within each cell. There may be STI regions within a cell, especially when the cell has more than two stages, however the STI regions 36 also act to divide and isolate active areas from one another and form cell boundaries between the cells at the block level. The STI regions forming cell boundaries straddle the border of two adjacent cells. The active areas include the diffusion 24,26 and gate areas 34. The supply nets 20,18 are supply connections between positive-channel 26 and negative-channel diffusion 24 and respective power rails 14,16 ($V_{DD}, V_{SS}$). The supply nets may be configured along a boundary or an edge 39 of the cell. A boundary or edge 39 of the cell is defined by a continuous STI region 36 that straddles across two adjacent cells, at the block level, between power and ground rails 14,16. With this arrangement each cell may have at least one positive net and/or at least one negative net along an edge. Therefore adjacent cells may or may not have corresponding supply nets along bordering edges.

Figure 2:
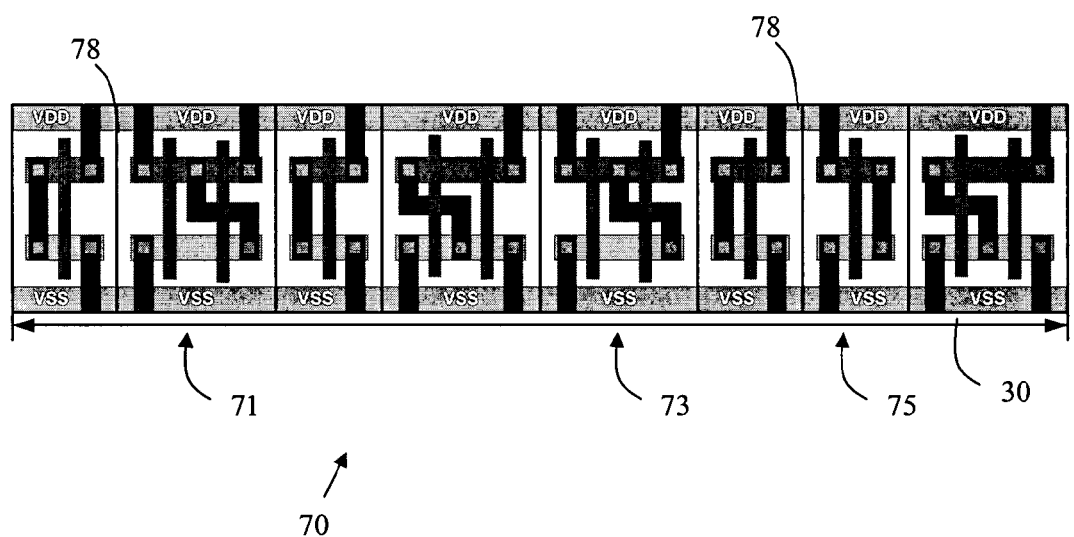
FIG. 2 shows a physical layout design of cell structures of FIG. 1 reconfigured in accordance with an embodiment of the invention.

FIG. 2 shows a layout symbolic representation 70 of the row of logic cells of FIG. 1, however, cells with corresponding nets along an edge of bordering cells may be flipped about a y-axis (not shown) of the cell. The flipped cells 71,73,75 have edges with corresponding positive nets and negative nets of adjacent cells orientated to lie adjacent across the cell boundary of the adjacent cell 78. It will be appreciated that it may not be necessary to flip any cells, for example, adjacent cells may already have corresponding nets along the boundary 78. Additionally, FIG. 2 shows respective positive and negative net orientation, however, advantages of embodiments of the invention may be achieved with orientating the cells such that only the same net type (i.e. positive nets or alternatively the negative nets) of each adjacent cell lie along the edge of the boundary between the two cells.

Figure 3:
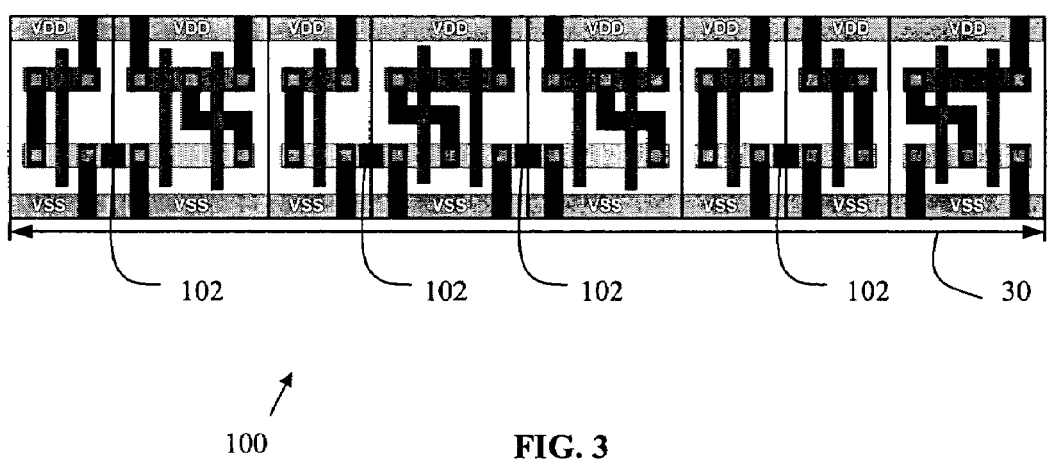
FIG. 3 Shows a physical layout design of cell structures of FIG. 2 having continuous active areas in accordance with an embodiment of the invention.

FIG. 3 shows the cell row arrangement of FIG. 2 in accordance with an embodiment of the invention the area bound between the corresponding supply nets of the two adjacent cells are filled at the block level above the cells with additional diffusion 102. This filling of diffusion alters the overall diffusion profile of the adjacent cells. The two adjacent cells having an edge with corresponding NMOS ($V_{SS}$) negative nets that lie on either side of the cell boundary form a continuous negative-channel diffusion 24. Nets 18,20 accordingly continue to interconnect diffusions 24,26 for each cell. It will be appreciated that the same process may be applied to the positive-channel 26 diffusion. In CMOS technology the advantages of filling the negative-channel diffusion of NMOS improves performance, however, the invention is not limited to filling only the negative-channel diffusion.

The additional diffusion 102 may be filled with various techniques known in the field, such as a dummy layer or abutment algorithm method, grow/shrink method, and the like. For example in the dummy layer approach, each cell is built, or modified such that a dummy mask layer is added in the region between the cell border, and the diffusion which connects to a $V_{SS}$ net. This will have a minimum width of "W", by virtue of manufacturing design rules. At the block level, when a dummy layer width is equal to "2W", then the dummy layer is replaced with diffusion fill. In the grow/shrink approach, at the block level all NMOS diffusion is grown in the horizontal direction by an amount "W". All regions where a short circuit between different nets has occurred on diffusion, the area "shrinks" back to "W". All other areas that do not shrink to "W" are diffusion fills between the same nets (such as $V_{SS}$) across a cell boundary. It will be appreciated by a skilled reader that other techniques exist, and the dummy layer and grow/shrink approaches are provided as examples.

Figure 4A:
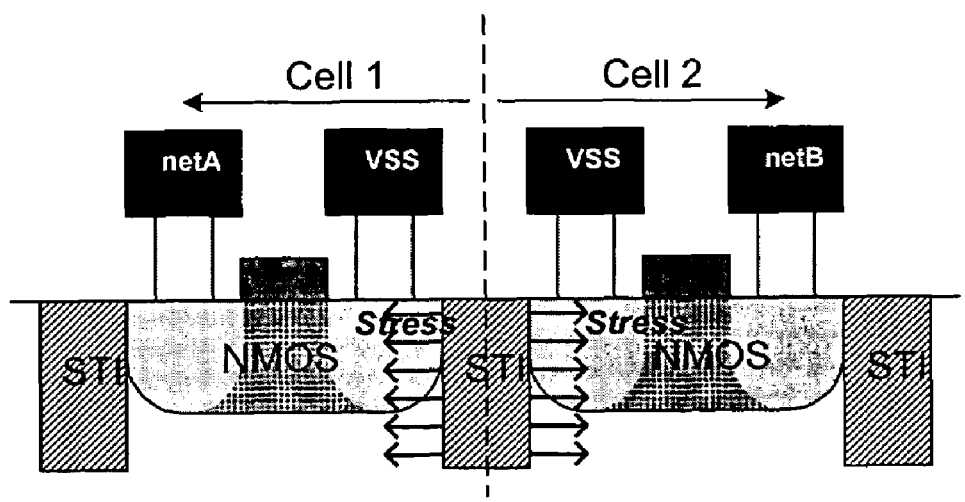
FIG. 4A-B shows a schematic diagram of a side view of NMOS regions of two adjacent cells in accordance with an embodiment of the invention.
Figure 4B:
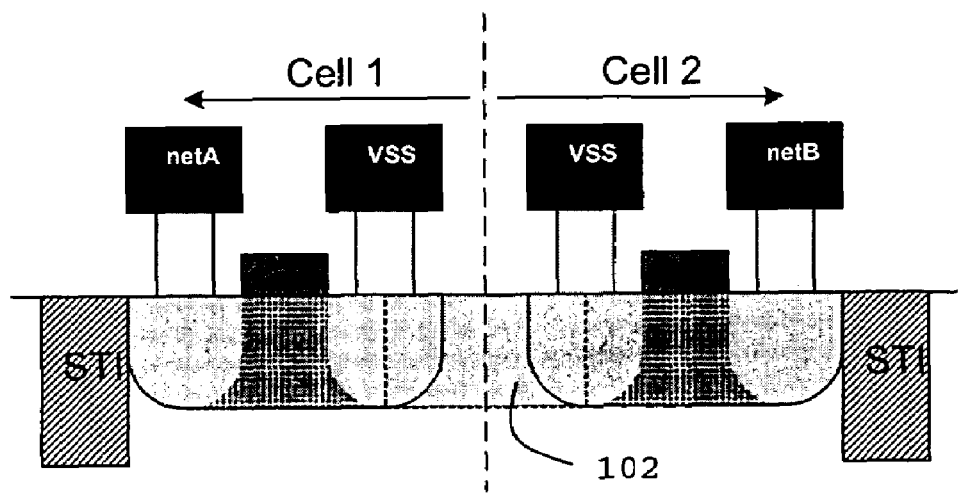

FIG. 4A-B shows schematic diagrams of a side view of NMOS regions of two adjacent cells in accordance with an embodiment of the invention. FIG. 4A shows the STI and active regions and the stress resulting from STI being a harder material than the diffusion regions (NMOS or PMOS). The pushing force between the two materials creates stress which impacts the performance. By filling the STI region with diffusion, the stress is removed, as shown in FIG. 4B. Diffusion may be added where adjacent supply nets connected to the same power or ground. The diffusion fill is added between cell 1 and cell 2 at the block level of the IC, which is the next level up in the design hierarchy, above the cell level, and consists of multiple rows of such cells.

Figures 5A, 5B:
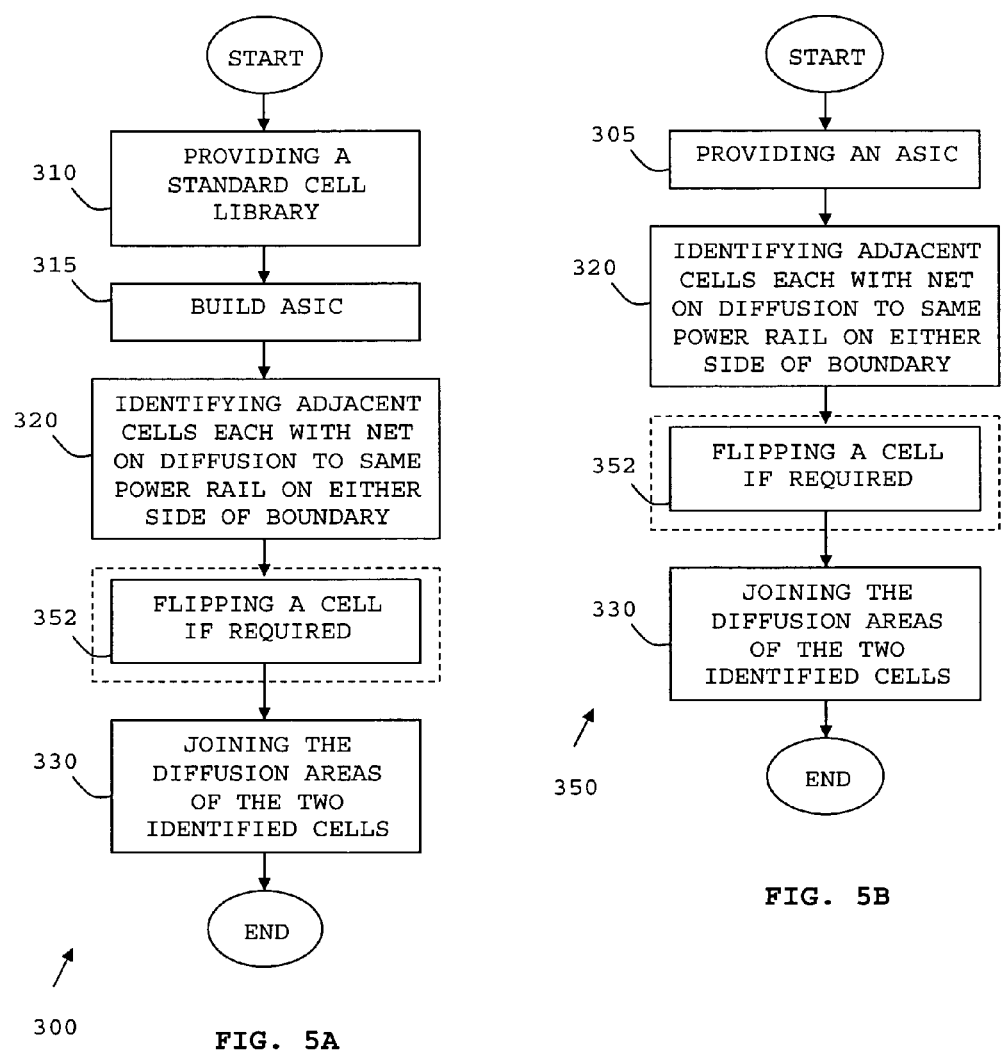
FIG. 5A-B are flow charts of methods in accordance with an embodiment of the invention.

FIG. 5A shows a flow chart of a method 300 in accordance with an embodiment of the invention. As discussed, a standard cell library is provided 310. The ASIC 315 is built from a cell, or more typically a collection of cells in the library. In building an integrated circuit such as ASIC (or block thereof) cells are interconnected to effect a specific function. Those cells may be arranged in an array of rows. When an ASIC block is built, using automated or custom place and route tools two adjacent cells are identified 320 along the row that have the same net, for example $V_{SS}$, on diffusion on either side of a boundary between the two cells. The diffusion areas associated with the supply nets of the two cells are joined 330 such that the two adjacent cells that are identified with corresponding nets form a single continuous diffusion area. An additional step of flipping 352 a cell is optional (as indicated by dashed box) if the cell needs to be flipped so that the same net is on diffusion on either side of a boundary. FIG. 5B shows a flow chart of a method 350 in accordance with another embodiment that shares steps 320,330 and may also have the optional flipping step 352 as set out in the method of FIG. 5A. However, the method of FIG. 5B begins with having the ASIC provided 305.

With a shared diffusion configuration, the active areas, i.e. negative and positive diffusion channels 24,26 have a longer continuous length than the arrangement of FIG. 1. A longer continuous diffusion channel length reduces the number interfaces occurring between active diffusion areas and STI regions along a row of cells. For example, for cells 33,35 in FIG. 1, the number of active diffusion area and STI region interactions is halved as shown in comparing FIGS. 1 and 3. The reduction in the occurrences of stress between the STI regions and the active diffusion areas correlates with an improvement in performance.

An embodiment of the invention may be implemented with computer aided design (CAD) systems that are well known to a skilled person. Well known hardware description languages (HDL), such as Very High Speed Integrated Circuit Hardware Description Language (VHDL) and VERILOG, both international standard languages of Institute of Electrical and Electronic Engineers, Inc. (IEEE), may be used to implement the invention to describe an ASIC, which is then synthesized into detailed logic functions comprising standard cells. An example of a tool to perform the synthesis is DESIGN COMPILER (DESIGN COMPILER is a trademark in certain countries of Synopsys, Inc. of Mountain View, Calif., United States of America). The cell library may also be designed with modelling tools or logic schematic programs on a CAD system to create symbolic representations such as a layout of logic functions, for example, VIRTUOSO (VIRTUOSO is a trademark in certain countries of Cadence Design Systems, Inc., of San Jose, Calif., United States of America). Of course, the ASIC may be built in rows of standard cells as mentioned above, or by other techniques known such as custom transistor level layout or the like. ASIC developers may use "place and route" (P&R) tools to flip the cells as required for increasing the applicability of the technique. The placement and routing tools generate the associated mask patterns to physically wire the standard cells in the manner required to implement the ASIC function. While placement tools provide initial placement of cells in a block or IC when the routing needs are estimated, routing tools are capable of moving cells from their initial placement once the routing needs are known. Examples of "place and route" tools that may be used are PHYSICAL COMPILER and ASTRO, respectively (PHYSICAL COMPILER and ASTRO are trademarks in certain countries of Synopsys, Inc.). The hardware and software required to implement the invention, and indicated for explaining the preferred embodiment should not be limiting. Similarly, the software processes running on them may be arranged, configured or distributed in any manner suitable for performing the invention defined by the claims.

It will be understood that the block level diffusion fill method as described above provides advantages such as limiting the occurrence of stress between active areas and STI regions of the logic cells and improving overall performance. Additionally, embodiments may be applied to all types of ASICS, whether the ASIC is built from a collection of logic cells of a standard cell library (as discussed above) or from other techniques such as from full custom layout and the like. It will be appreciated that specific embodiments of the invention are discussed for illustrative purposes, and various modifications may be made without departing from the scope of the invention as defined by the appended claims.

What is claimed is:

1. A method for optimising transistor performance in an integrated circuit, comprising:
    providing an integrated circuit having at least two cells, each cell having a logic function defined by interconnections between active regions of the cell, non-active regions of the cell and power rails, each cell having an edge defined by a non-active region and each cell having a connection between an active region and a power rail;
    identifying at least two adjacent cells each having a corresponding connection between an active region and the same power rail; and
    joining the respective active regions associated with each corresponding connection of each cell with an additional diffusion area across the boundary between the cells forming a connected diffusion of the two adjacent cells.

2. The method of claim 1 wherein the active regions comprise a positive diffusion area, a negative diffusion area and a gate area.

3. The method of claim 2 wherein the connected diffusion is the negative diffusion area.

4. The method of claim 2 wherein the connected diffusion is the positive diffusion area.

5. The method of claim 2 wherein the negative diffusion areas of the adjacent cells are connected and the positive diffusion areas of the adjacent cells are connected.

6. The method of claim 1 wherein the corresponding connection is positioned along the edge of the cell forming a boundary between the two cells and the two corresponding connections.

7. The method of claim 1 further comprising reorientating a cell having a corresponding connection positioned along an edge, the cell being reoriented with the edge having the corresponding connection adjacent to and forming the boundary between the two cells for joining the diffusion areas.

8. The method of claim 1 wherein the non-active region is a shallow trench isolation (STI) region.

9. The method of claim 1 wherein the active regions and non-active regions are comprised of materials having different physical properties.

10. The method of claim 1 wherein the joining step comprises applying a grow/shrink procedure to join the diffusion areas of each cell.

11. The method of claim 1 wherein the integrated circuit is an application specific integrated circuit (ASIC) having the cells arranged using synthesis and place and route tools into rows interconnected to effect the ASIC's function.

12. The method of claim 1 wherein the cells are standard cells.

13. The method of claim 1 wherein the integrated circuit is an application specific integrated circuit (ASIC) having cells arranged and interconnected using custom placement tools to effect the ASIC's function.

14. The method of claim 1 wherein the cells are custom transistor-level layout cells.

15. A method for building an integrated circuit having a connected diffusion cell architecture, comprising:
    providing a logic cell library, each cell of the logic cell library having a logic function defined by interconnections between active regions of the cell, non-active regions of the cell and power rails, each cell of the logic cell library having an edge defined by a non-active region, and each cell of the logic cell library having a connection between an active region and a power rail;
    placing cells from the logic cell library into an integrated circuit;
    identifying at least two adjacent cells in the integrated circuit each having a corresponding connection between an active region and the same power rail; and
    joining the respective active regions associated with each corresponding connection of each cell with an additional diffusion area across the boundary between the cells forming a connected diffusion of the two adjacent cells.

16. The method of claim 15 wherein the active regions comprise a positive diffusion area, a negative diffusion area and a gate area.

17. The method of claim 16 wherein the connected diffusion is the negative diffusion area.

18. The method of claim 16 wherein the connected diffusion is the positive diffusion area.

19. The method of claim 16 wherein the negative diffusion areas of the adjacent cells are connected and the positive diffusion areas of the adjacent cells are connected.

20. The method of claim 15 wherein the corresponding connection is positioned along the edge of the cell forming a boundary between the two cells and the two corresponding connections.

21. The method of claim 15 further comprising reorientating a cell having a corresponding connection positioned along an edge, the cell being reoriented with the edge having the corresponding connection adjacent to and forming the boundary between the two cells for joining the diffusion areas.

22. The method of claim 15 wherein the non-active region is a shallow trench isolation (STI) region.

23. The method of claim 15 wherein the active regions and non-active regions are comprised of materials having different physical properties.

24. The method of claim 15 wherein the joining step comprises applying a grow/shrink procedure to join the diffusion areas of each cell.

25. The method of claim 15 wherein the integrated circuit is an application specific integrated circuit (ASIC) having the cells arranged using synthesis and place and route tools into rows interconnected to effect the ASIC's function.

26. The method of claim 15 wherein the cells are standard cells.

27. The method of claim 15 wherein the integrated circuit is an application specific integrated circuit (ASIC) having cells arranged and interconnected using custom placement tools to effect the ASIC's function.

28. The method of claim 15 wherein the cells are custom transistor-level layout cells.

29. The method of claim 15 wherein the joining step comprises applying an abutment algorithm to join the diffusion areas of each cell.

30. An integrated circuit having a connected diffusion cell architecture, comprising:

at least two adjacent cells, each cell having a logic function defined by interconnections between active regions of the cell, non-active regions of the cell and power rails, each cell having an edge defined by a non-active region, each cell having a connection between an active region and a power rail; and additional diffusion area across the boundary between adjacent cells joining respective active regions associated with corresponding connections between the active region of each cell and the same power rail, the additional diffusion area forming a connected diffusion of the two adjacent cells.

31. The integrated circuit of claim 30 wherein the active regions comprise a positive diffusion area, a negative diffusion area and a gate area.

32. The integrated circuit of claim 31 wherein the connected diffusion is the negative diffusion area.

33. The integrated circuit of claim 31 wherein the connected diffusion is the positive diffusion area.

34. The integrated circuit of claim 31 wherein the negative diffusion areas of the adjacent cells are connected and the positive diffusion areas of the adjacent cells are connected.

35. The integrated circuit of claim 30 wherein the non-active region is a shallow trench isolation (STI) region.

36. The integrated circuit of claim 30 wherein the active regions and non-active regions are comprised of materials having different physical properties.

37. The integrated circuit of claim 30 wherein the cells are standard cells.

38. The integrated circuit of claim 30 wherein the cells are custom transistor-level layout cells.

* * * * *